United States Patent
Heo et al.

(10) Patent No.: US 9,960,309 B2
(45) Date of Patent: May 1, 2018

(54) PHOTOELECTRONIC DEVICE INCLUDING CHARGE BARRIER

(71) Applicant: Samsung Electronics Co., Ltd., Suwon-si, Gyeonggi-do (KR)

(72) Inventors: Jinseong Heo, Seoul (KR); Kiyoung Lee, Seoul (KR); Jaeho Lee, Seoul (KR); Sangyeob Lee, Hwaseong-si (KR); Eunkyu Lee, Yongin-si (KR); Seongjun Park, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 50 days.

(21) Appl. No.: 15/181,804

(22) Filed: Jun. 14, 2016

(65) Prior Publication Data

US 2017/0236968 A1  Aug. 17, 2017

(30) Foreign Application Priority Data

Feb. 15, 2016  (KR) .................... 10-2016-0017196

(51) Int. Cl.
  *H01L 31/109*  (2006.01)
  *H01L 31/0392*  (2006.01)
  (Continued)

(52) U.S. Cl.
  CPC ...... *H01L 31/109* (2013.01); *H01L 31/02161* (2013.01); *H01L 31/022466* (2013.01); *H01L 31/0336* (2013.01); *H01L 31/0392* (2013.01)

(58) Field of Classification Search
  CPC . H01L 31/0328; H01L 31/0256; H01L 31/04; H01L 31/042
  See application file for complete search history.

(56) References Cited

U.S. PATENT DOCUMENTS

| 6,268,615 B1 | 7/2001 | Liu et al. |
| 8,187,913 B2 * | 5/2012 | Kawano ............. H01L 31/18 136/244 |

(Continued)

FOREIGN PATENT DOCUMENTS

| KR | 20110100927 A | 9/2011 |
| KR | 20120102067 A | 9/2012 |
| KR | 20140091812 A | 7/2014 |

OTHER PUBLICATIONS

Filip A. Rasmussen et al., "Computational 2D Materials Database, Electronic Structure of Transition-Metal Dichalcogenides and Oxides", The Journal of Physical Chemestry C, Apr. 27, 2016, C2015, 119, pp. 13169-13183.

(Continued)

*Primary Examiner* — Yu-Hsi D Sun
(74) *Attorney, Agent, or Firm* — Harness, Dickey & Pierce, P.L.C.

(57) ABSTRACT

A photoelectronic device includes a semiconductor substrate doped with a first type impurity, a second semiconductor layer doped with a second type impurity of an opposite type to the first type impurity, a transparent electrode formed on a second surface of the second semiconductor layer, the second surface being opposite a first surface on which the semiconductor substrate is formed, and a barrier layer disposed between the second semiconductor layer and the semiconductor substrate or between the second semiconductor layer and the transparent electrode. The second semiconductor layer has a band gap energy less than that of the semiconductor substrate, and the barrier layer includes a semiconductor material or an insulator having a band gap greater than that of the semiconductor substrate.

20 Claims, 3 Drawing Sheets

(51) Int. Cl.
    *H01L 31/0336*     (2006.01)
    *H01L 31/0224*     (2006.01)
    *H01L 31/0216*     (2014.01)

(56) References Cited

U.S. PATENT DOCUMENTS

| | | |
|---|---|---|
| 8,603,581 B2 | 12/2013 | Bryden et al. |
| 9,343,601 B2 | 5/2016 | Choi et al. |
| 9,472,711 B2 * | 10/2016 | Matsuura ............ H01L 31/0682 |
| 2007/0227587 A1 * | 10/2007 | Walsh ................... H01L 31/075 |
| | | 136/252 |
| 2011/0214736 A1 | 9/2011 | Lee et al. |
| 2014/0252415 A1 | 9/2014 | Nayfeh |
| 2015/0144882 A1 | 5/2015 | Kelber |
| 2016/0343891 A1 | 11/2016 | Heo et al. |

OTHER PUBLICATIONS

Jian-Sheng Jie, et al. "$MoS_2$/Si Heterojunction with Vertically Standing Layered Structure for Ultrafast, High-Detectivity, Self-Driven Visible-Near Infrared Photodetectors," Advanced Functional Materials, pp. 1-10, (2015).

Lanzhong Hao, et al. "Electrical and photovoltaic characteristics of MoS2/Si p-n. junctions," Journal of Applied Physics, vol. 117, pp. 114502-1 - 114502-6 (2015).

* cited by examiner

PHOTOELECTRONIC DEVICE INCLUDING CHARGE BARRIER

CROSS-REFERENCE TO RELATED APPLICATION

This application claims the benefit of Korean Patent Application No. 10-2016-0017196, filed on Feb. 15, 2016, in the Korean Intellectual Property Office, the disclosure of which is incorporated herein in its entirety by reference.

BACKGROUND

1. Field

Example embodiments relate to photoelectronic devices including a charge barrier configured to repress moving of charges generated by an optical absorption layer.

2. Description of the Related Art

A photoelectronic device uses photoelectronic effect and includes a photo-detector, a phototransistor, and a solar cell, etc.

A photo-detector of the related art includes a silicon p-n junction. As the pixel size becomes as small as approximately 1 µm, an amount of received light is reduced. Also, due to the limit of the band gap (1.1 eV) of silicon, an amount of received light in a near infrared region (~850 nm) is relatively small. Accordingly, the sensitivity of optical detection is reduced when the intensity of illumination is relatively low and in the near infrared region.

Recently, a photo-detector that includes graphene and transition metal dichalcogenide (TMD) has been developed. This photo-detector has a thickness of a few nm and relatively high photo sensitivity. The TMD material has an optical absorption rate one hundred times greater than that of silicon. Thus, although the TMD material is relatively thin, the TMD material has a relatively high optical detection efficiency. Single-layered graphene has a surface resistance of approximately 100 ohm/sq and a light absorption rate of 2.3%, and thus, may be used as a transparent electrode.

In a photo-detector that includes TMD, the TMD absorbs light, and electrons and holes generated accordingly move to electrodes (for example, graphene) formed on both sides of the TMD.

At this point, even though light is not irradiated to the TMD, a dark current may flow therethrough according to a voltage applied to the electrodes. The dark current may act as signal noise, and thus, the sensitivity of detection of the photo-detector may be reduced.

SUMMARY

Example embodiments provide photoelectronic devices including a charge barrier configured to repress a charge movement.

Additional aspects will be set forth in part in the description which follows and, in part, will be apparent from the description, or may be learned by practice of the example embodiments.

According to example embodiments, a photoelectronic device includes a semiconductor substrate doped with a first type impurity; a second semiconductor layer doped with a second type impurity of an opposite type to the first type impurity; a transparent electrode on a second surface of the second semiconductor layer, the second surface being opposite a first surface on which the semiconductor substrate is formed; and a barrier layer between the second semiconductor layer and the semiconductor substrate or between the second semiconductor layer and the transparent electrode, wherein the second semiconductor layer has a band gap energy smaller than that of the semiconductor substrate.

The semiconductor substrate may include silicon.

The barrier layer may include an insulator or a semiconductor material having a band gap energy of 1.1 eV or more.

The insulating layer may include at least one of silicon oxide, alumina, hafnium oxide, and hexagonal boron nitride (h-BN).

The semiconductor material may include at least one of $GaS_2$, $SnS_2$, GaSe, GaN, SiC, ZnS, ZnSe, ZnTe, and GaP.

The barrier layer may have a thickness of 10 nm or less.

The barrier layer may be a third semiconductor layer on the semiconductor substrate, and the third semiconductor layer may extends from the semiconductor substrate and contacts the second semiconductor layer and is doped with the second impurity.

The second semiconductor layer may include at least one of Ge, transition metal dichalcogenide, InAs, GaSb, InSb, and quantum dots.

The transition metal dichalcogenide may include at least one of $WTe_2$, $MoTe_2$, and black phosphorus.

The barrier layer may include a first barrier layer between the second semiconductor layer and the semiconductor substrate; and a second barrier layer between the second semiconductor layer and the transparent electrode.

The first barrier layer may be a third semiconductor layer that extends and contacts the second semiconductor layer on the semiconductor substrate and is doped with the second impurity.

The photoelectronic device may further include a passivation layer on the transparent electrode.

According to example embodiments, a photoelectronic device includes a semiconductor substrate including a plurality of semiconductor regions doped with a first type impurity and insulating regions between the adjacent semiconductor regions; a second semiconductor layer that covers at least the plurality of semiconductor regions on the semiconductor substrate and is doped with a second type impurity of an opposite type to the first type impurity; a transparent electrode formed on a second surface of the second semiconductor layer, the second surface being opposite a first surface on which the semiconductor substrate is formed; and a barrier layer disposed between the second semiconductor layer and the semiconductor substrate or between the second semiconductor layer and the transparent electrode, wherein the second semiconductor layer has a band gap energy smaller than that of the semiconductor substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
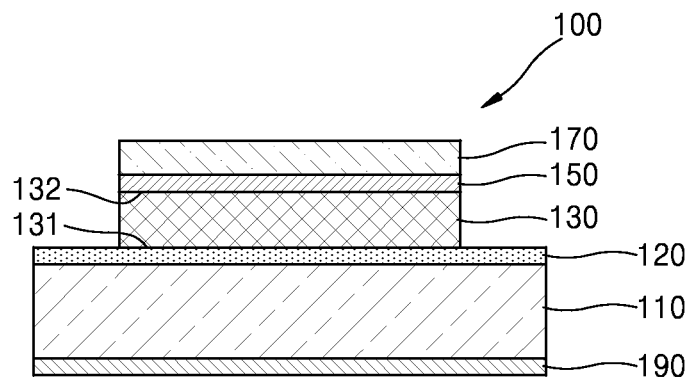
FIG. 1 is a schematic cross-sectional view of a structure of a photoelectronic device including a charge barrier according to example embodiments.

Reference will now be made in detail to embodiments, examples of which are illustrated in the accompanying drawings. In the drawings, thicknesses of layers and regions may be exaggerated for clarity of layers and regions. Example embodiments of the present inventive concepts are capable of various modifications and may be embodied in many different forms.

It will be understood that when an element or layer is referred to as being "on" or "above" another element or layer may include when an element or a layer is directly or indirectly on the other element or layer.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a schematic cross-sectional view of a structure of a photoelectronic device 100 including a charge barrier according to example embodiments.

Referring to FIG. 1, a barrier layer 120, a second semiconductor layer 130, and a transparent electrode 150 are sequentially formed on a semiconductor substrate 110. A first electrode 190 electrically connected to the semiconductor substrate 110 is formed on a lower side of the semiconductor substrate 110. The first electrode 190 may be a contact electrode. The transparent electrode 150 may be connected to a contact electrode (not shown). The second semiconductor layer 130 has a first surface 131 and a second surface 132 facing each other. The semiconductor substrate 110 is formed on the first surface 131 and the transparent electrode 150 is formed on the second surface 132 of the second semiconductor layer 130.

The semiconductor substrate 110 may be doped with a first type impurity. The semiconductor substrate 110 may be a silicon substrate. The first type impurity may be an n-type impurity or a p-type impurity. The semiconductor substrate 110 may be referred to as a first semiconductor layer. The semiconductor substrate 110 may have a thickness in a range from about 0.1 μm to about 3 μm. The first electrode 190 may include an electrode metal or may be a lower region of the semiconductor substrate 110 that is highly doped with the first type impurity.

The barrier layer 120 may have band gap energy greater than that of the semiconductor substrate 110. For example, the barrier layer 120 may have a band gap greater than 1.1 eV. The barrier layer 120 may perform a function of blocking a dark current flow.

The barrier layer 120 may include an insulator or a semiconductor. The insulator may include at least one of silicon oxide, alumina, hafnium oxide, and hexagonal boron nitride.

The semiconductor may include a two-dimensional semiconductor material, e.g., $GaS_2$, $SnS_2$, or GaSe, or a semiconductor material including at least one of GaN, SiC, ZnS, ZnSe, ZnTe, and GaP.

The barrier layer 120 is a charge barrier layer. The barrier layer 120 may be formed to have a thickness of 10 nm or less so that charges may move when light is irradiated thereon. When the barrier layer 120 has a thickness of 10 nm or less, a transit time taken by charges to move through the barrier layer 120 may be shorter than a recombination time of electrons and charges. Accordingly, charges generated by the semiconductor substrate 110 and the second semiconductor layer 130 by absorbing light may move to the transparent electrode 150 and the first electrode 190, and accordingly, a photoelectronic current may be generated.

The second semiconductor layer 130 may include a semiconductor doped with a second type impurity, and may also include a semiconductor having a higher optical absorption rate than that of the semiconductor substrate 110. Accordingly, the second semiconductor layer 130 may be formed to have a thickness less than that of a silicon p-n junction photodiode of the related art. The second semiconductor layer 130 may include a material having a band gap energy less than that of the semiconductor substrate 110. The second semiconductor layer 130 may be referred to as an optical absorption layer.

The second type impurity has a different polarity from that of the first type impurity. For example, if the first type impurity is an n-type impurity, the second type impurity is a p-type impurity, and if the first type impurity is a p-type impurity, the second type impurity is an n-type impurity. In the descriptions below, the first type impurity is an n-type impurity, and the second type impurity is a p-type impurity. The second semiconductor layer 130 may have a thickness of about 1 μm or less.

The second semiconductor layer 130 may include at least one of Ge, transition metal dichalcogenide, InAs, GaSb, InSb, and quantum dots. The transition metal dichalcogenide may include at least one of $WTe_2$, $MoTe_2$, and black phosphorus.

The quantum dots may have a monolayer structure or a multilayer structure. The quantum dots may include at least one of PbS, PbSe, CdTe, and AgS.

The transparent electrode 150 may include a material having relatively high optical transmissivity so that light from the external environment is more easily transmitted therethrough. The transparent electrode 150 may include graphene or indium tin oxide (ITO). The transparent electrode 150 may include 1~4 layer graphene.

A passivation layer 170 may further be formed on the transparent electrode 150. The passivation layer 170 may include a material that transmits light. The passivation layer 170 may protect the layers thereunder and may function as an anti-reflection layer. For example, the passivation layer 170 may include titanium oxide.

Charges transmitted through the semiconductor substrate 110 are collected in the first electrode 190. The first electrode 190 is shown as being under the semiconductor substrate 110 in FIG. 1, but the location of the first electrode 190 is not limited thereto. For example, the first electrode 190 may be formed to contact an upper surface of the semiconductor substrate 110.

Electrons and holes are generated at the second semiconductor layer 130 and the semiconductor substrate 110 when the second semiconductor layer 130 and the semiconductor substrate 110 absorb light. A further larger amount of charges are generated at the second semiconductor layer 130 than the semiconductor substrate 110. An optical current may be generated according to the movement of the generated electrons and charges. For example, holes generated at the second semiconductor layer 130 by absorbing light moves to the transparent electrode 150, and electrons may move to the first electrode 190 through the barrier layer 120 and the semiconductor substrate 110. The electrons generated by the absorption of light may have energy that may jump over a band gap of the barrier layer 120, and thus, may flow through the barrier layer 120. Of the holes and electrons generated at the semiconductor substrate 110, the electrons may move to the first electrode 190 and the holes may move to the second semiconductor layer 130 through the barrier layer 120.

The photoelectronic device 100 may be a photo-detector or a solar cell.

Prior to irradiating light onto the second semiconductor layer 130 of the photoelectronic device 100 according to example embodiments, a dark current may be generated due to a potential difference between the first electrode 190 and the transparent electrode 150. However, because the barrier layer 120 having a band gap energy greater than that of the second semiconductor layer 130 reduces the probability of tunneling of the dark current, the flow of a dark current between the first electrode 190 and the transparent electrode 150 may be repressed. The photoelectronic device 100 according to example embodiments may have relatively high detectivity and may be operated under relatively low illumination atmosphere because the dark current is reduced.

Also, because a material having a relatively high light absorption rate is used to form the second semiconductor layer 130, miniaturization of the photoelectronic device 100 may be possible.

In FIG. 1, the barrier layer 120 is disposed between the semiconductor substrate 110 and the second semiconductor layer 130, but the current embodiment is not limited thereto. For example, the barrier layer 120 may be disposed between the second semiconductor layer 130 and the transparent electrode 150 to repress the movement of the holes to the transparent electrode 150, and thus, the dark current may be reduced.

Figure 2:
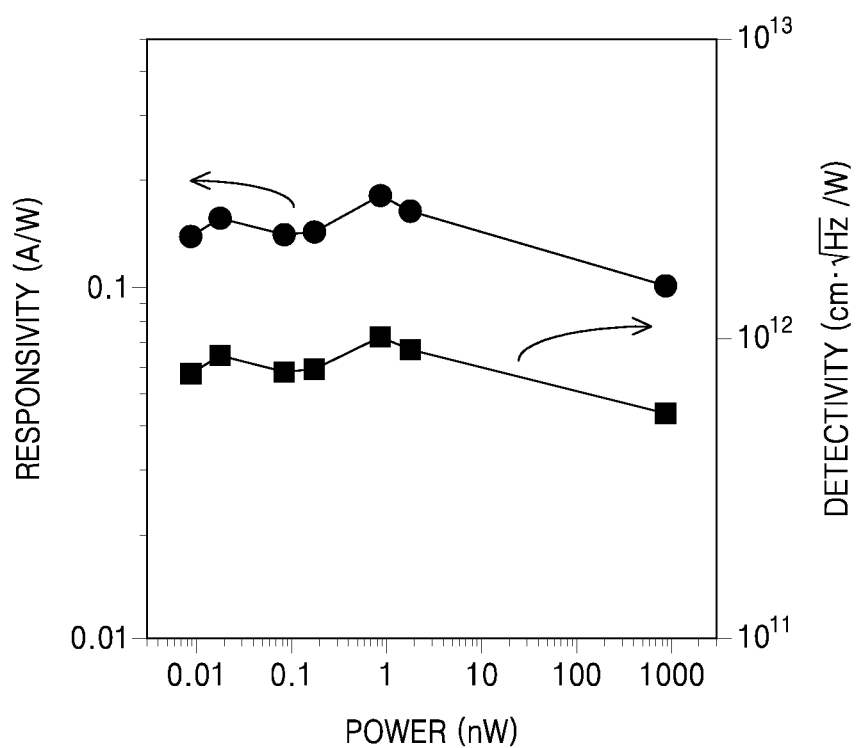
FIG. 2 is a graph showing characteristics of a photoelectronic device according to example embodiments.

FIG. 2 is a graph showing characteristics of the photoelectronic device 100 according to example embodiments. The photoelectronic device 100 according to example embodiments includes a silicon oxide barrier layer, a $MoTe_2$ second semiconductor layer, and a graphene transparent electrode that are sequentially formed on an n-type silicon substrate.

Referring to FIG. 2, the responsivity and detectivity of the photoelectronic device 100 respectively are 0.18 Amp/Watt and $10^{12}$ Jones as favorable. This is assumed that due to the presence of the barrier layer 120, the dark current is repressed.

Figure 3:
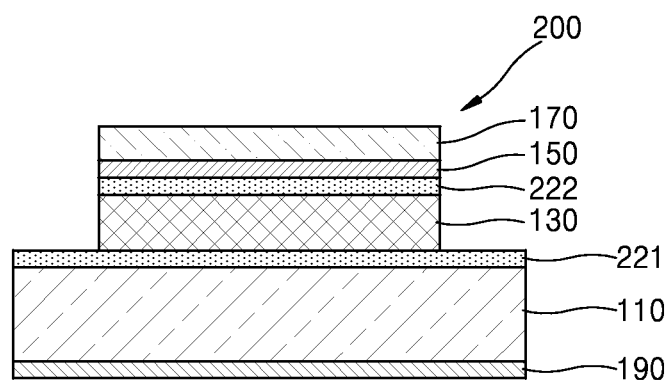
FIG. 3 is a schematic cross-sectional view of a structure of a photoelectronic device according to example embodiments.

FIG. 3 is a schematic cross-sectional view of a structure of a photoelectronic device 200 according to example embodiments. Like reference numerals are used to indicate elements that are substantially identical to the elements of FIG. 1, and the detailed description thereof will not be repeated.

When the photoelectronic device 200 is compared to the photoelectronic device 100 of FIG. 1, the photoelectronic device 200 includes two barrier layers instead of one barrier layer.

A first barrier layer 221 may be formed between the semiconductor substrate 110 and the second semiconductor layer 130, and a second barrier layer 222 may be formed between the second semiconductor layer 130 and the transparent electrode 150.

The first barrier layer 221 may be a silicon layer formed by extending from the semiconductor substrate 110. The first barrier layer 221 may be doped with a second type impurity different from the impurity doped in the semiconductor substrate 110.

The first barrier layer 221 may reduce or prevent charges generated at the second semiconductor layer 130 from moving to the semiconductor substrate 110, and thus, a dark current may be repressed.

The second barrier layer 222 may be substantially identical to the barrier layer 120 in FIG. 1.

In FIG. 3, the first barrier layer 221 is a silicon layer doped with a second type impurity, but example embodiments are not limited thereto. For example, the first barrier layer 221 may also be substantially the same as the barrier layer 120.

The photoelectronic device 200 according to example embodiments may further repress a dark current than the photoelectronic device 100 because the second barrier layer 222 is included. However, the photoelectronic efficiency may be slightly reduced.

Figure 4:
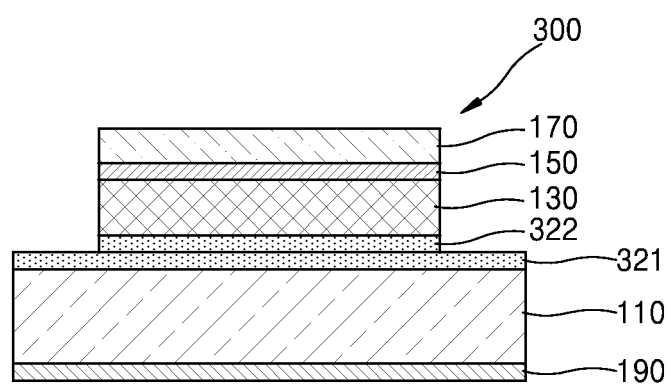
FIG. 4 is a schematic cross-sectional view of a structure of a photoelectronic device according to example embodiments.

FIG. 4 is a schematic cross-sectional view of a structure of a photoelectronic device 300 according to example embodiments. Like reference numerals are used to indicate elements that are substantially identical to the elements of FIGS. 1 and 3, and the detailed description thereof will not be repeated.

When the photoelectronic device 300 is compared to the photoelectronic device 200, a second barrier layer 322 may be directly formed on a first barrier layer 321 in the photoelectronic device 300.

The first barrier layer 321 may be a silicon layer formed by extending from the semiconductor substrate 110. The first barrier layer 321 may be doped with a second type impurity different from the impurity doped in the semiconductor substrate 110.

The second barrier layer 322 may be substantially identical to the barrier layer 120.

Figure 5:
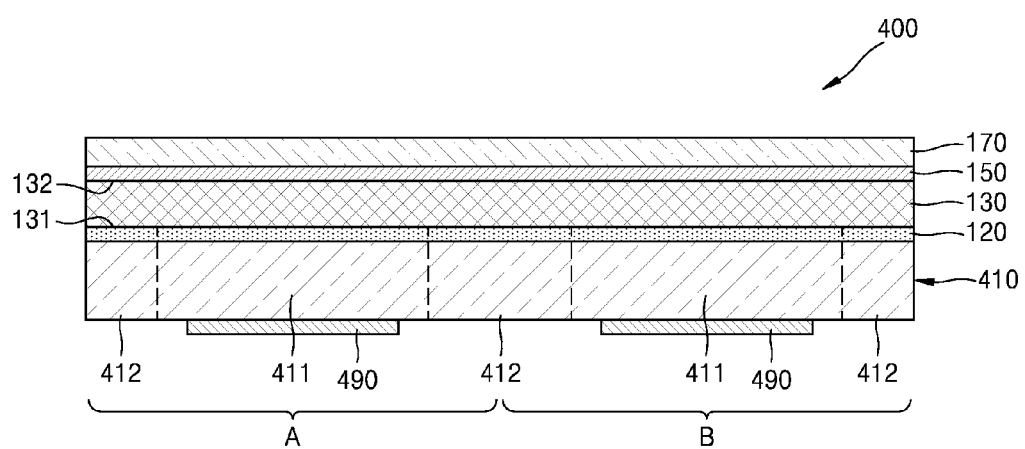
FIG. 5 is a schematic cross-sectional view of a structure of a photoelectronic device according to example embodiments.

FIG. 5 is a schematic cross-sectional view of a structure of a photoelectronic device 400 according to example embodiments. Like reference numerals are used to indicate elements that are substantially identical to the elements of FIG. 1, and the detailed description thereof will not be repeated.

Referring to FIG. 5, the photoelectronic device 400 may include a plurality of photoelectronic devices disposed in an array. In FIG. 5, two photoelectronic devices are depicted for convenience.

The photoelectronic device 400 may include a plurality of pixel regions. A single photoelectronic device may be disposed in each of the pixel regions. In FIG. 5, two pixel regions are depicted for convenience. A semiconductor substrate 410 includes a pixel region A and a pixel region B. The pixel region A and the pixel region B include a semiconductor region 411 doped with a first type impurity and an insulating region 412 around the semiconductor region 411. A common insulating region is formed between the pixel regions. The first type impurity may be an n-type impurity or a p-type impurity.

The barrier layer 120, the second semiconductor layer 130, and the transparent electrode 150 are sequentially formed on the semiconductor substrate 410. The transparent electrode 150 may be a common electrode.

A first electrode 490 electrically connected to the semiconductor region 411 may be formed on a lower side of the semiconductor substrate 410. The first electrode 490 may formed in each pixel region. The first electrode 490 may be a contact electrode. The transparent electrode 150 may also be connected to a contact electrode (not shown). The second semiconductor layer 130 may have a first surface 131 and a second surface 132 facing each other. The semiconductor substrate 410 may be formed on the first surface 131, and the transparent electrode 150 may be formed on the second surface 132.

The barrier layer 120 may have band gap energy greater than that of the semiconductor substrate 410. For example, the barrier layer 120 may have a band gap greater than 1.1 eV. The barrier layer 120 may reduce or prevent the flow of a dark current. The barrier layer 120 may include an insulator or a semiconductor.

The second semiconductor layer 130 may include a semiconductor doped with a second type impurity. The second semiconductor layer 130 may include a material having band gap energy lower than that of the semiconductor substrate 410. The second type impurity has a different polarity from the first type impurity. For example, if the first type impurity is an n-type impurity, the second type impurity is a p-type impurity, and vice versa. In the descriptions below, the first type impurity is an n-type impurity and the second type impurity is a p-type impurity. The second semiconductor layer 130 may have a thickness of 1 µm or less. The second semiconductor layer 130 may include a material having an optical absorption rate greater than that of the semiconductor substrate 410.

The transparent electrode 150 may include a material having relatively high optical transmissivity so that light from the external environment is more easily transmitted. The transparent electrode 150 may include graphene or ITO. A contact electrode (not shown) may further be connected to the transparent electrode 150.

Charges that pass through the semiconductor substrate 410 may be collected in the first electrode 490. In FIG. 5, the first electrode 190 is depicted on a lower side of the semiconductor substrate 410, but example embodiments are not limited thereto. For example, the first electrode 490 may be formed to contact an upper surface of the semiconductor substrate 410.

The photoelectronic device 400 may be used as a photoelectronic region of a charge image sensor.

The operation of the photoelectronic device 400 in each pixel may be well understood from the embodiment described above, and thus, the detailed description thereof will be omitted.

The photoelectronic device 400 includes the barrier layer 120, the second semiconductor layer 130, and the transparent electrode 150 that continuously cover the semiconductor region 411 and the insulating region 412, but example embodiments are not limited thereto. For example, the barrier layer 120, the second semiconductor layer 130, and the transparent electrode 150 respectively may be formed only on the semiconductor region 411.

The photoelectronic device according to example embodiments may be manufactured to be relatively small because a semiconductor layer having a relatively high optical absorption rate is used.

Because the photoelectronic device includes a barrier layer that represses the movement of charges, the detectivity of the photoelectronic device may be increased by reducing a dark current.

While example embodiments have been described with reference to the figures, it will be understood by those of ordinary skill in the art that various changes in form and details may be made therein without departing from the spirit and scope as defined by the following claims.

What is claimed is:

1. A photoelectronic device comprising:
   a semiconductor substrate doped with a first type impurity;

a second semiconductor layer doped with a second type impurity having an opposite type to the first type impurity;

a transparent electrode on a second surface of the second semiconductor layer, the second surface being opposite a first surface on which the semiconductor substrate is formed; and a barrier layer between the second semiconductor layer and the semiconductor substrate or between the second semiconductor layer and the transparent electrode, wherein the second semiconductor layer has a band gap energy less than that of the semiconductor substrate.

2. The photoelectronic device of claim 1, wherein the semiconductor substrate includes silicon.

3. The photoelectronic device of claim 2, wherein the barrier layer includes one of an insulator and a semiconductor material having a band gap energy of about 1.1 eV or greater.

4. The photoelectronic device of claim 3, wherein the insulator includes at least one of silicon oxide, alumina, hafnium oxide, and hexagonal boron nitride (h-BN).

5. The photoelectronic device of claim 3, wherein the semiconductor material includes at least one of $GaS_2$, $SnS_2$, GaSe, GaN, SiC, ZnS, ZnSe, ZnTe, and GaP.

6. The photoelectronic device of claim 1, wherein the barrier layer has a thickness of about 10 nm or less.

7. The photoelectronic device of claim 1, wherein the barrier layer is a third semiconductor layer on the semiconductor substrate, the third semiconductor layer extending from the semiconductor substrate and contacting the second semiconductor layer and being doped with the second impurity.

8. The photoelectronic device of claim 1, wherein the second semiconductor layer includes at least one of Ge, transition metal dichalcogenide, InAs, GaSb, InSb, and quantum dots.

9. The photoelectronic device of claim 8, wherein the transition metal dichalcogenide includes at least one of $WTe_2$, $MoTe_2$, and black phosphorus.

10. The photoelectronic device of claim 1, wherein the barrier layer comprises:

a first barrier layer between the second semiconductor layer and the semiconductor substrate; and a second barrier layer between the second semiconductor layer and the transparent electrode.

11. The photoelectronic device of claim 10, wherein the first barrier layer is a third semiconductor layer on the semiconductor substrate, the third semiconductor layer extending from the semiconductor substrate and contacting the second semiconductor layer and being doped with the second impurity.

12. The photoelectronic device of claim 1, further comprising:

a passivation layer on the transparent electrode.

13. A photoelectronic device comprising:

a semiconductor substrate including a plurality of semiconductor regions doped with a first type impurity and insulating regions between the adjacent semiconductor regions;

a second semiconductor layer that covers at least the plurality of semiconductor regions on the semiconductor substrate and is doped with a second type impurity of an opposite type to the first type impurity;

a transparent electrode on a second surface of the second semiconductor layer, the second surface being opposite a first surface on which the semiconductor substrate is formed; and a barrier layer between the second semiconductor layer and the semiconductor substrate or between the second semiconductor layer and the transparent electrode, wherein the second semiconductor layer has a band gap energy less than that of the semiconductor substrate.

14. The photoelectronic device of claim 13, wherein the semiconductor regions includes silicon.

15. The photoelectronic device of claim 14, wherein the barrier layer includes one of an insulator and a semiconductor material having a band gap of about 1.1 eV or greater.

16. The photoelectronic device of claim 15, wherein the insulator includes at least one of silicon oxide, alumina, hafnium oxide, and h-BN.

17. The photoelectronic device of claim 15, wherein the semiconductor material includes at least one of $GaS_2$, $SnS_2$, GaSe, GaN, SiC, ZnS, ZnSe, ZnTe, and GaP.

18. The photoelectronic device of claim 13, wherein the barrier layer has a thickness of about 10 nm or less.

19. The photoelectronic device of claim 13, wherein the barrier layer is a third semiconductor layer on the semiconductor substrate, the third semiconductor layer extending from the semiconductor substrate and contacting the second semiconductor layer and being doped with the second impurity.

20. The photoelectronic device of claim 13, wherein the second semiconductor layer includes at least one of Ge, transition metal dichalcogenide, InAs, GaSb, InSb, and quantum dots.

* * * * *